US010177085B2

(12) United States Patent
Perot et al.

(10) Patent No.: US 10,177,085 B2
(45) Date of Patent: Jan. 8, 2019

(54) POWER COMMUTATION MODULE

(71) Applicant: Aptiv Technologies Limited, St. Michael (BB)

(72) Inventors: Aymeric Perot, Epernon (FR); Erwan Guillanton, Epernon (FR)

(73) Assignee: APTIV TECHNOLOGIES LIMITED (BB)

( * ) Notice: Subject to any disclaimer, the term of this patent is extended or adjusted under 35 U.S.C. 154(b) by 0 days.

(21) Appl. No.: 15/603,921

(22) Filed: May 24, 2017

(65) Prior Publication Data

US 2017/0345749 A1 Nov. 30, 2017

(51) Int. Cl.
H01L 23/50 (2006.01)
B60R 16/023 (2006.01)
H01L 23/367 (2006.01)
H01L 25/07 (2006.01)
H05K 7/14 (2006.01)
H05K 1/02 (2006.01)

(52) U.S. Cl.
CPC .......... H01L 23/50 (2013.01); B60R 16/0238 (2013.01); H01L 23/367 (2013.01); H01L 25/072 (2013.01); H05K 1/0263 (2013.01); H05K 7/1432 (2013.01); H05K 1/0207 (2013.01); H05K 2201/10166 (2013.01); H05K 2201/10272 (2013.01)

(58) Field of Classification Search
CPC ...................................................... H01L 23/50
See application file for complete search history.

(56) References Cited

U.S. PATENT DOCUMENTS 6,845,017 B2 * 1/2005 Ahmed ................... H01L 23/50
257/691
2003/0223257 A1* 12/2003 Onoe ...................... H02J 1/102
363/144
2016/0324002 A1 11/2016 Tazarine et al.

FOREIGN PATENT DOCUMENTS

CN 203826375 U 9/2014
EP 1100294 A2 5/2001
WO 2015104072 A1 7/2015

* cited by examiner

Primary Examiner — Fernando L Toledo
Assistant Examiner — Valerie N Newton
(74) Attorney, Agent, or Firm — Robert J. Myers

(57) ABSTRACT

A power commutation module includes a printed circuit board, a first plate-shaped bus bar, and a first plurality of power switches each including a plurality of connection pins which are connected on the upper face of the printed circuit board and a metal base plate which is applied against the bus bar. The first plurality of power switches is mounted on the first bus bar. The power switches are generally aligned along a longitudinal edge of the first bus bar, in that said longitudinal edge of the first bus bar is arranged along a first longitudinal edge of the printed circuit board, and the portion of the first bus bar on which the power switches are mounted is arranged next to the printed circuit board.

7 Claims, 2 Drawing Sheets

POWER COMMUTATION MODULE

CROSS-REFERENCE TO RELATED APPLICATION

This application claims the benefit under 35 U.S.C. § 119(a) of Patent Application No. 1654711 filed in the Institut National de la Propriété Industrielle (French Patent Office) on May 25, 2016, the entire disclosure of which is hereby incorporated by reference.

TECHNICAL FIELD OF THE INVENTION

The invention relates to a power commutation module, and more particularly to a specific arrangement of power metal-oxide semiconductor field-effect transistors (MOSFET) on a printed circuit board.

BACKGROUND OF THE INVENTION

Power commutation modules for the electrical distribution of a vehicle in general include a printed circuit board provided with a power transistor and with bus bars. It is known to solder the power transistors on the printed circuit board on one face and also to fix bus bars on the printed circuit board. The bus bars are generally fixed on the printed circuit face opposite the power transistors. The bus bars are in contact with the power transistors by means of a plated-through hole, and thus allow the cooling of the power transistors. However, the printed circuit board has the constraint of having to be provided with power transistors which are generally bulky and drain strong currents. These constraints require a large printed circuit board surface not only for placing there at the power transistors, in order to support the large currents passing therethrough, but also for supporting some of the heat dissipation required for the transistors.

It is therefore important to propose a new solution solving these problems.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions.

BRIEF SUMMARY OF THE INVENTION

According to one embodiment, a power commutation module is presented. The module includes a printed circuit board, a plate-shaped first bus bar, and a first plurality of power switches. Each power switch has a plurality of connection pins which are connected on an upper face of the printed circuit board and a metal base plate which is applied against the first bus bar. The first plurality of power switches is mounted on the first bus bar. The first plurality of power switches are generally aligned along a longitudinal edge of the first bus bar, in that said longitudinal edge of the first bus bar is arranged along a first longitudinal edge of the printed circuit board, and in that a portion of the first bus bar on which the first plurality of power switches are mounted is arranged next to the printed circuit board.

The first bus bar may be generally arranged in the same plane as the printed circuit board. The first bus bar may include fixing tabs consisting of a single piece with the first bus bar. The fixing tabs extend from a straight edge of the first bus bar up to a lower face of the printed circuit board opposite the upper face. The fixing tabs are fixed on the lower face of the printed circuit board.

The power commutation module may further include a second plurality of power switches which is mounted on a plate-shaped second bus bar. The second bus bar and the second plurality of power switches are arranged in a similar manner to the first bus bar and to the first plurality of power switches along another edge of the printed circuit board. The first bus bar and the second bus bar may be arranged on either side of two opposite longitudinal edges of the printed circuit board, respectively.

The first and/or second plurality of power switches may be of a surface-mounted component type.

BRIEF DESCRIPTION OF THE SEVERAL VIEWS OF THE DRAWING

The present invention will now be described, by way of example with reference to the accompanying drawings, in which.

DETAILED DESCRIPTION OF THE INVENTION

Figure 1:
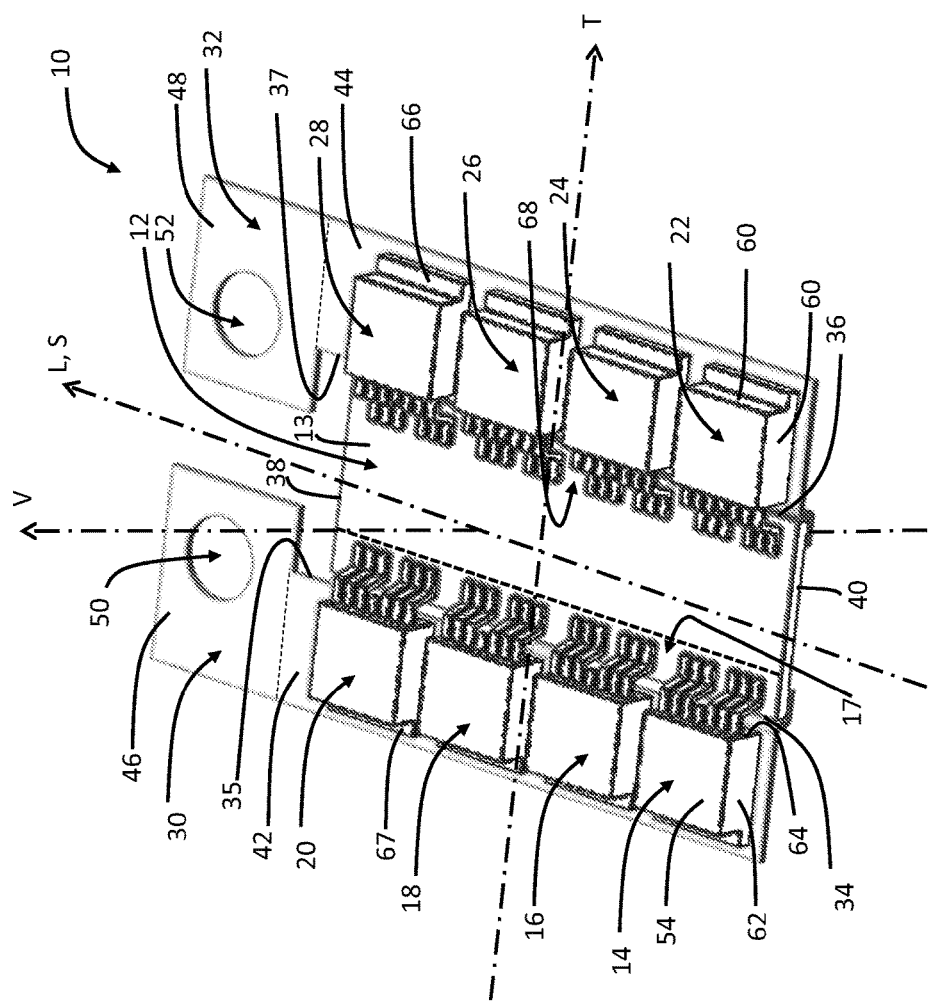
FIG. 1 is a schematic top view of the power commutation module according to the invention.

A non-limiting example of a power commutation module suitable for use in a motor vehicle is illustrated in FIG. 1. The power commutation module 10 includes a printed circuit board 12, eight power switches 14, 16, 18, 20, 22, 24, 26, 28, a first bus bar 30 and a second bus bar 32. In order to geometrically position the mentioned elements, there is defined, in a non-limiting manner, an orthogonal reference system including a longitudinal axis L, a transverse axis T and a vertical axis V.

The printed circuit board 12 has a planar rectangular shape. The printed circuit board 12 is positioned in a horizontal plane defined by the longitudinal axis L and the transverse axis T. The two opposite sides of greater length than the other two sides 38, 40 of the printed circuit board 12 define a first 34 and a second 36 longitudinal edge, respectively.

The first bus bar 30 and the second bus bar 32 in the shape of a plate are positioned on either side of the two longitudinal edges 34, 36 of the printed circuit board 12. In other words, the first and second bus bars 30, 32 are positioned next to the two longitudinal edges 34, 36, outside the surface of the printed circuit board 12, and also neither above, nor below the printed circuit board 12. The first and second bus bars 30, 32 are generally in the shape of an 'L'. The first and second bus bars 30, 32 include a longitudinal portion 42, 44 of rectangular shape, one straight edge 35, 37 of which extends longitudinally and parallel to the two longitudinal edges 34, 36 of the printed circuit board 12. The longitudinal portion 42, 44 is substantially the same length as the two longitudinal edges 34, 36 of the printed circuit board 12. The first and second bus bars 30, 32 also include a second part 46, 48 of rectangular shape extending transversally along the same transverse side 38 of the printed circuit board 12. The two second parts 46, 48 have a transverse length that is identical to the other and are dimensioned such as to not be in contact with each other. The first and second bus bars 30, 32 are positioned symmetrically with respect one another along a symmetry longitudinal axis S of the printed circuit board 12. The second parts 46, 48 of the first and second bus bars 30, 32 include a circular hole 50, 52 allowing the insertion of an electrical fixing means such as a terminal screwed to connect the power commutation module to the electrical distribution network of the vehicle. The first and second bus bars 30, 32 are ideally arranged in the same horizontal plane as the printed circuit board 12, however the process for assembling the first and second bus bars 30, 32 can only allow a placement of the bus bars generally in the same horizontal plane as the printed circuit board 12.

The eight power switches 14, 16, 18, 20, 22, 24, 26, 28 are grouped together in two sets of four switches 14, 16, 18, 20. The switches 14, 16, 18, 20, 22, 24, 26, 28 shown in FIG. 1 are surface-mounted component- and D2Pack package-type power switches.

A D2Pack package is a package of rectangular parallelepiped or cuboid shape including an upper face 54 and a lower face which are parallel and extend in the horizontal plane and are spaced apart by the four lateral faces 58, 60, 62, 64 of the rectangular parallelepiped. The lower face is provided with a connection metal base plate 66, and one of the lateral faces 64 is provided with a plurality of connection pins 68. Typically, when the switch 14 is a power transistor of the insulated-gate field-effect transistor type, more commonly called a metal-oxide semiconductor field-effect transistors (MOSFET), the plurality of connection pins 68 includes a pin called a control gate, several current input/output pins called a 'source' and finally a current input/output metal base plate 66 called a 'drain'.

The connection pins 68 of each switch 14, 16, 18, 20 are soldered on the upper face 13 of the printed circuit board 12 on a connection area 17. The connection pins 68 of a first plurality of switches 14, 16, 18, 20 extend transversally from each package lateral face 64 parallel to the vertical plane defined by the vertical axis V and the longitudinal axis L up to the connection area 17 for connecting the pins on the printed circuit board 12. The connection area 17 for connecting the connection pins 68 of the first plurality of switch 14, 16, 18, 20 extends longitudinally parallel to and at a short distance from a longitudinal edge 34 of the printed circuit board 12 such that each metal base plate 66, 67 can be mounted so as to be applied on a longitudinal portion 42 arranged proximate and parallel to said longitudinal edge 34 of the printed circuit board 12. The metal base plates 67 of the first plurality of four switches 14, 16, 18, 20 are therefore mounted to be ideally aligned with each other on the bus bar portion arranged longitudinally directly next to a longitudinal edge 34 of the printed circuit board 12. However, the process for assembling the four switches 14, 16, 18, 20 only allows a generally aligned positioning of the four switches 14, 16, 18, 20. The second plurality of four switches 22, 24, 26, 28 is mounted so as to be symmetrical with the first plurality of switches 14, 16, 18, 20, along the symmetry longitudinal axis S of the printed circuit board 12.

Figure 2:
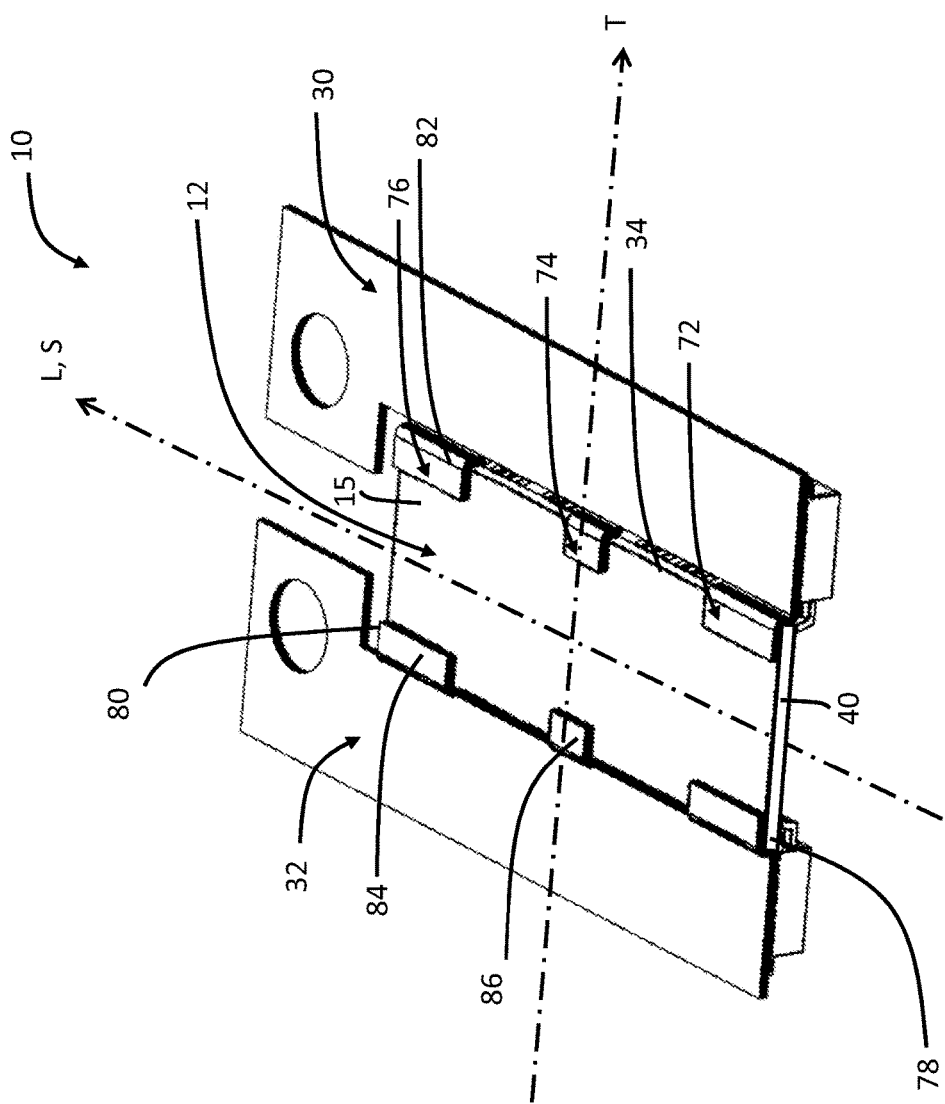
FIG. 2 is a schematic bottom view of the power commutation module according to the invention.

FIG. 2 shows the lower face 15 of the printed circuit board 12. The first and second bus bars 30, 32 include means for fixing to the printed circuit board 12. The fixing means are tabs 72, 74, 76 consisting of a single piece with the first and second bus bars 30, 32. The tabs 72, 74, 76, of which there are three per the first and second bus bars 30, 32, are soldered on the lower face 15 of the printed circuit board 12. The tabs 72, 74, 76 of each of the first and second bus bars 30, 32 are curved on the rims of the longitudinal edges 34, 36 of the printed circuit board 12.

Each of the first and second bus bars 30, 32 includes two tabs 72, 76 fixed at each end 78, 80 of the longitudinal edges 34, 36 of the printed circuit board 12, the third tab 74 being fixed approximately at equal distance from the other two tabs 72, 76. Each tab 72, 74, 76 includes a curved part 82 surrounding the rims of the longitudinal edges 34, 36 of the printed circuit board 12 and a rectangular part 84, 86 soldered on the lower face 15 of the printed circuit board 12. Each rectangular part 84 of the tabs 72, 76 fixed at each end 78, 80 of the longitudinal edges 34, 36 extends longitudinally from each transverse edge 38, 40 of the printed circuit board 12 towards the surface of the printed circuit board 12.

Each rectangular part 84, 86 of the tabs 72, 74, 76 includes transverse sides of same length whereas the longitudinal sides of the rectangular parts 84 of the tabs 72, 76 fixed at each end 78, 80 of the longitudinal edges 34, 36 are longer than the longitudinal sides of the rectangular parts 86 of the third tab 74. This difference is due to the need for reinforcing the rigidity of the commutation module at the ends of the printed circuit board.

The first and second bus bars 30, 32 are thus held substantially in the same plane as the printed circuit board 12 by means of the first and second bus bars 30, 32 being held at the printed circuit board 12 by the fixing tabs 72, 74, 76, and via the switches 14, 16, 18, 20, 22, 24, 26, 28, the connection pins 68 of which are soldered on the printed circuit board 12 and the metal base plates 66, 67 of which are soldered on the first and second bus bars 30, 32.

In an operational manner, the printed circuit board 12 includes an electric signal connection area allowing the operation of the power commutation module 10. There are typically three electric signals. Two electric signals are control signals for the two pluralities of switches 14, 16, 18, 20, 22, 24, 26, 28 series connected to the control gates of each switch 14, 16, 18, 20. The third signal is typically a strong current input electrically connected to the 'sources' of the two plurality of switches 14, 16, 18, 20, 22, 24, 26, 28.

The first and second bus bars 30, 32 are connected to the 'drains' of the two plurality of switches 14, 16, 18, 20, 22, 24, 26, 28, respectively. Thus, each switch 14, 16, 18, 20 can be controlled independently of each other in 'open switch' or 'closed switch' mode. When a plurality of switches 14, 16, 18, 20 is controlled in closed switch mode, the strong input current flows as far as the 'sources' of the controlled plurality of switches 14, 16, 18, 20, and, since the plurality of switches 14, 16, 18, 20 receives on the gates thereof a 'closed switch' command, the current passes through the switches 14, 16, 18, 20 and therefore flows on the bus bar 30 on which the drains or metal base plates 67 thereof are mounted. When the two plurality of switches 14, 16, 18, 20, 22, 24, 26, 28 are controlled in 'open switch' mode, the strong input current becomes distributed through the two plurality of switches 14, 16, 18, 20, 22, 24, 26, 28 and is therefore distributed on the first and second bus bars 30, 32.

It will be noted that each plurality of four switches 14, 16, 18, 20 is an electrical assembly of four switches in parallel. The drains are connected together on the bus bar 30, the sources are connected together on the printed circuit board 12 and the control gates are connected together on the printed circuit board 12. It will be noted that the two plurality of switches 14, 16, 18, 20, 22, 24, 26, 28 are connected together at a common source since the sources of the two plurality of switches 14, 16, 18, 20, 22, 24, 26, 28 are connected together.

The arrangement of the power commutation module 10 described above allows the constraints on the printed circuit board 12 to be reduced. The printed circuit board 12 only includes components on a single face. The size of the printed circuit board 12 is reduced since the metal base plates 66, 67 are directly mounted on the first and second bus bars, the first and second bus bars 30, 32 being arranged close to the outer periphery of the printed circuit board 12. The printed circuit board 12 does not have the constraint of heat dissipation of the switches 14, 16, 18, 20, 22, 24, 26, 28 since the first and second bus bars 30, 32 conduct the strong current and allow for direct cooling of the package of each switch 14, 16, 18, 20, 22, 24, 26, 28.

The particularly advantageous layout of the first and second bus bars 30, 32 substantially in the same plane as the printed circuit board 12 allows for minimizing the height of the power commutation module 10 and also allows for optimizing the constraints of heat dissipation and of fixing the power commutation module 10. The symmetrical layout of the first and second bus bars 30, 32 and of the two pluralities of switches 14, 16, 18, 20, 22, 24, 26, 28 allows for minimizing the undesirable electrical effects of power commutation such as delays for switches 14, 16, 18, 20, 22, 24, 26, 28 between the two series and bad distribution of current and therefore of heat in the first and second bus bars 30, 32.

Alternatively, the power commutation module 10 can include only a single plurality of switches 14, 16, 18, 20. The number of switches 14, 16, 18, 20 per series is not limited to four and can consequently be greater or less. It is possible for the first and second bus bars 30, 32 to not be substantially arranged in the same horizontal plane as the printed circuit board 12. The first and second bus bars 30, 32 can be inclined along the vertical axis V independently of each other. The printed circuit board 12 and the first and second bus bars 30, 32 can have various geometric shapes depending on the constraints for integrating the power commutation module 10 into the vehicle. The means for fixing the bus bar to the electrical distribution network of the vehicle can be different to that shown by FIG. 1.

While this invention has been described in terms of the preferred embodiments thereof, it is not intended to be so limited, but rather only to the extent set forth in the claims that follow. Moreover, the use of the terms first, second, primary secondary, etc. does not denote any order of importance, but rather the terms first, second, etc. are used to distinguish one element from another. Furthermore, the use of the terms a, an, etc. do not denote a limitation of quantity, but rather denote the presence of at least one of the referenced items.

We claim:

1. A power commutation module, comprising:
   a printed circuit board;
   a plate-shaped first bus bar; and
   a first plurality of power switches each including a plurality of connection pins which are connected on an upper face of the printed circuit board and a metal base plate which is applied against the first bus bar,
   wherein the first plurality of power switches is mounted on the first bus bar, the first plurality of power switches being generally aligned along a longitudinal edge of the first bus bar, in that said longitudinal edge of the first bus bar is arranged along a first longitudinal edge of the printed circuit board, and in that a portion of the first bus bar on which the first plurality of power switches are mounted is arranged next to the printed circuit board.

2. The power commutation module according to claim 1, wherein the first bus bar is generally arranged in the same plane as the printed circuit board.

3. The power commutation module according to claim 1, wherein the first bus bar includes fixing tabs consisting of a single piece with the first bus bar, wherein the fixing tabs extend from a straight edge of the first bus bar up to a lower face of the printed circuit board opposite the upper face, and wherein the fixing tabs are fixed on the lower face of the printed circuit board.

4. The power commutation module according to claim 1, further comprising a second plurality of power switches which is mounted on a plate-shaped second bus bar, wherein the second bus bar and the second plurality of power switches are arranged in a similar manner to the first bus bar and to the first plurality of power switches along another edge of the printed circuit board.

5. The power commutation module according to claim 4, wherein the first bus bar and the second bus bar are arranged on either side of two opposite longitudinal edges of the printed circuit board, respectively.

6. The power commutation module according to claim 4, wherein the second plurality of power switches are of a surface-mounted component type.

7. The power commutation module according to claim 1, wherein the first plurality of power switches are of a surface-mounted component type.

\* \* \* \* \*